United States Patent [19]

Krebs et al.

[11] Patent Number: 4,751,707
[45] Date of Patent: Jun. 14, 1988

[54] LASER DIODE ARRAY EXHIBITING TRANSVERSE LASING

[75] Inventors: Danny J. Krebs, St. Charles County; Jean A. Schuette, Moline Acres; Robert R. Rice, Florissant, all of Mo.

[73] Assignee: McDonnell Douglas Corporation, St. Louis, Mo.

[21] Appl. No.: 881,666

[22] Filed: Jul. 3, 1986

[51] Int. Cl.$^4$ ............................................. H01S 3/10
[52] U.S. Cl. ..................................... 372/44; 372/8; 372/26; 372/50
[58] Field of Search .......................... 372/44, 50, 26, 8

[56] References Cited

U.S. PATENT DOCUMENTS

| | | | |
|---|---|---|---|
| 3,969,686 | 7/1976 | Scifres et al. | 331/94.5 H |
| 4,063,189 | 12/1977 | Schifres et al. | 331/94.5 H |
| 4,099,999 | 7/1978 | Burnham et al. | 148/187 |
| 4,169,997 | 10/1979 | Logan et al. | 331/94.5 H |
| 4,190,809 | 2/1980 | Goodman et al. | 331/94.5 H |
| 4,194,933 | 3/1980 | Logan et al. | 148/171 |
| 4,269,635 | 5/1981 | Logan et al. | 148/171 |
| 4,280,106 | 7/1981 | Scifres et al. | 331/94.5 H |
| 4,280,108 | 7/1981 | Scifres et al. | 331/94.5 H |
| 4,348,763 | 9/1982 | Ackley et al. | 372/45 |
| 4,369,513 | 1/1983 | Umeda et al. | 372/46 |

FOREIGN PATENT DOCUMENTS 0154694 1/1984 Japan ................................ 372/50

OTHER PUBLICATIONS

"Leaky Wave Room-Temperature Double Heterostructure GaAs:GaAlAs Diode Laser", by D. R. Scifres, et al, *Applied Physics Letters*, vol. 29, pp. 23-25, Jul. 1, 1976.
"Leaky-Mode Buried-Heterostructure AlGaAs Injection Lasers", by Takashi Kajimura, et al, *Applied Physics Letters*, vol. 30, No. 11, pp. 590-591, Jun. 1, 1977.
"Phase Locked Semiconductor Array", by D. R. Scifres, et al, *Applied Physics Letters*, vol. 33, No. 12, pp. 1015-1017, Dec. 15, 1978.
"A Densely Packed Monolithic Linear Array of GaAs-$Al_xGa_{1-x}As$ As Strip Buried Heterostructure Laser", by W. T. Tsang, et al, Applied Physics Letters, vol. 34, No. 2, pp. 162-165, Jan. 15, 1979.
"High-Power Coupled-Multiple-Stripe Phase-Locked Injection Laser", by D. R. Scifres, et al, *Applied Physics Letters*, vol. 34, No. 4, pp. 259-261, Feb. 15, 1979.
"Improved Leaky Mode Buried Heterostructure (BH) Injection Lasers", by Robert D. Burnham, et al, *Xerox Disclosure Journal*, vol. 4, pp. 357-358, May/Jun. 1979.
"High-Power Leaky Mode Multiple-Stripe Laser", by D. E. Ackley, et al, *IEEE*, pp. 362-365, 1980.
"Q-Switched Semiconductor Diode Lasers", by Dean Z. Tsang, et al, *IEEE Journal of Quantum Electronics*, vol. QE-19, No. 2, pp. 145-156, 1983.

*Primary Examiner*—James W. Davie
*Assistant Examiner*—Xuan Vo
*Attorney, Agent, or Firm*—Rogers, Howell, Moore & Haferkamp

[57] ABSTRACT

A linear array of multimode laser diodes in a single wafer having a ratio of approximately one emitting stripe width to each non-emitting stripe isolation region width exhibits transverse lasing in a direction perpendicular to the normal laser output at input currents above a pre-determined transverse lasing threshold. Above the transverse lasing threshold, normal lasing is rapidly quenched.

21 Claims, 2 Drawing Sheets

LASER DIODE ARRAY EXHIBITING TRANSVERSE LASING

BACKGROUND AND SUMMARY OF THE INVENTION

Linear arrays of multimode laser diodes are well known in the art and generally comprise a plurality of stripes of p semiconductor material formed over additional layers of p material and n material in a wafer which is generally mounted to a heat sink and energized with a current source to induce lasing. Generally, these multistripe arrays are useful in that they increase the amount of laser output available from a semiconductor laser, and they may also be modulated by directly modulating the injection drive current, although no amplification is achieved by this direct modulation. Furthermore, there are limits to the amount of power output which can be achieved with a semiconductor multistripe laser diode device as catastrophic failure of the device occurs due to facet damage from overdriving, or in another manner due to excessive power densities in the device. Also known in the prior art is a technique for individually addressing and energizing the individual stripes of a multistripe array. This is generally achieved by forming separate electrical contacts on the individual stripes.

In working with multistripe laser diodes, the inventors herein have succeeded in reliably producing a phenomenon known as transverse lasing in a repeatable manner. Transverse lasing is characterized by a quenching of normal lasing along the length dimension of the stripe and the creation of a lasing effect in a perpendicular direction through the width of the array. This effect has been produced in multistripe laser arrays in which the ratio of emitting stripe width to non-emitting stripe isolation region width was substantially one-to-one. In such a wafer, there is a threshold for normal lasing such as would be ordinarily expected in a multistripe laser array. In wafers configured appropriately, a corresponding threshold current for transverse lasing has been found to be approximately twice that of the normal threshold. As this transverse threshold is reached, the normal output laser is very rapidly and effectively quenched, and transverse lasing is propagated through the wafer. It has also been found that repeatedly driving the current above this transverse lasing threshold results in no change to the power/current characteristics of the device, thereby indicating that transverse lasing does not result in damage to the wafer. Furthermore, because of the rapid switching from normal to transverse lasing at the threshold, it is anticipated that this effect can be used to provide a rather high speed communication device. In the preferred embodiment, switching rates have been achieved which indicate that frequencies as high as 50 MHz may be achieved.

A further feature and advantage of this transverse lasing phenomenon is the opportunity to achieve an amplification factor. This is because the injection current can be modulated in a relatively small band about the transverse lasing threshold which will cause the laser diode array to rapidly switch from normal lasing to transverse lasing at full power. Still another application for this device would utilize the individual stripe accessing technique already known in the prior art. By separately addressing the individual stripes, a high speed, multiple input, AND-gate may readily be achieved, and other logic elements could be formed as well.

The phenomenon of transverse lasing is generally thought to be due to parasitic oscillations in the device. Parasitic oscillation in laser diode devices has been known for some time, particularly with respect to broad area devices. However, the present invention differs from broad area lasers and other devices in which parasitic oscillation has been previously observed in that the parasitic oscillation in the present device depends upon the interaction of many otherwise normal lasers occupying the same planar waveguide and, to the inventor's knowledge, has not been achieved by others. This particular wafer arrangement makes the transverse lasing threshold for parasitic oscillation a well defined and repeatable parameter rendering it capable of useful application.

While some of the principal advantages and features of the present invention have been briefly described, a fuller understanding of the invention may be obtained by referring to the drawings and description of the preferred embodiment which follow.

DETAILED DESCRIPTION OF THE PREFERRED EMBODIMENT

Figure 1A:
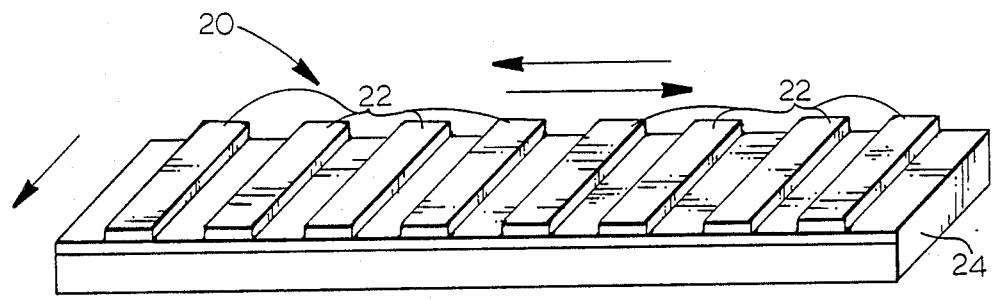
FIGS. 1A and 1B are perspective views of the laser diode array of the present invention.
Figure 1B:
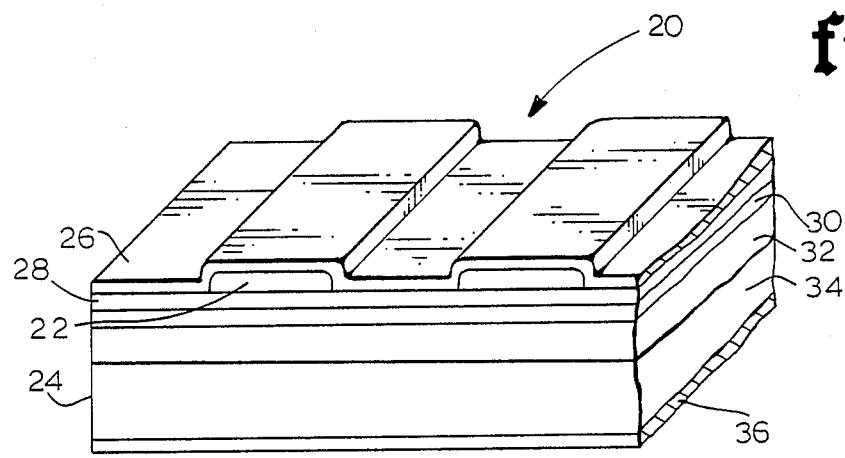
Figure 2:
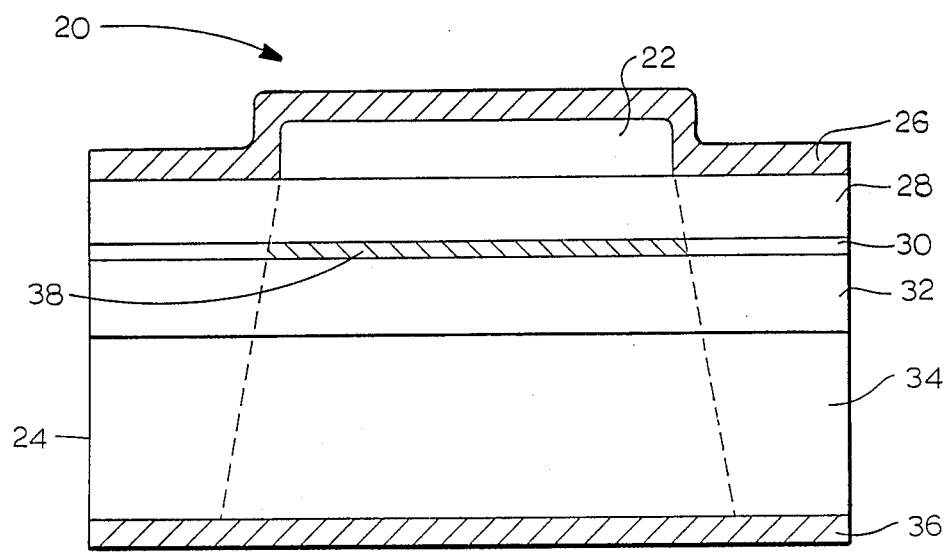
FIG. 2 is a cross-sectional view detailing the various lasers of the wafer which forms the present invention.
Figure 3:
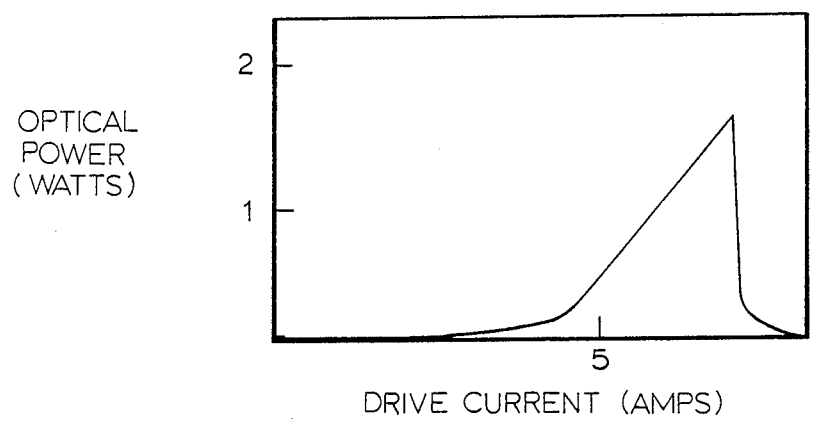
FIG. 3 is a graph of optical output power versus drive current for the device of the present invention.
Figure 4:
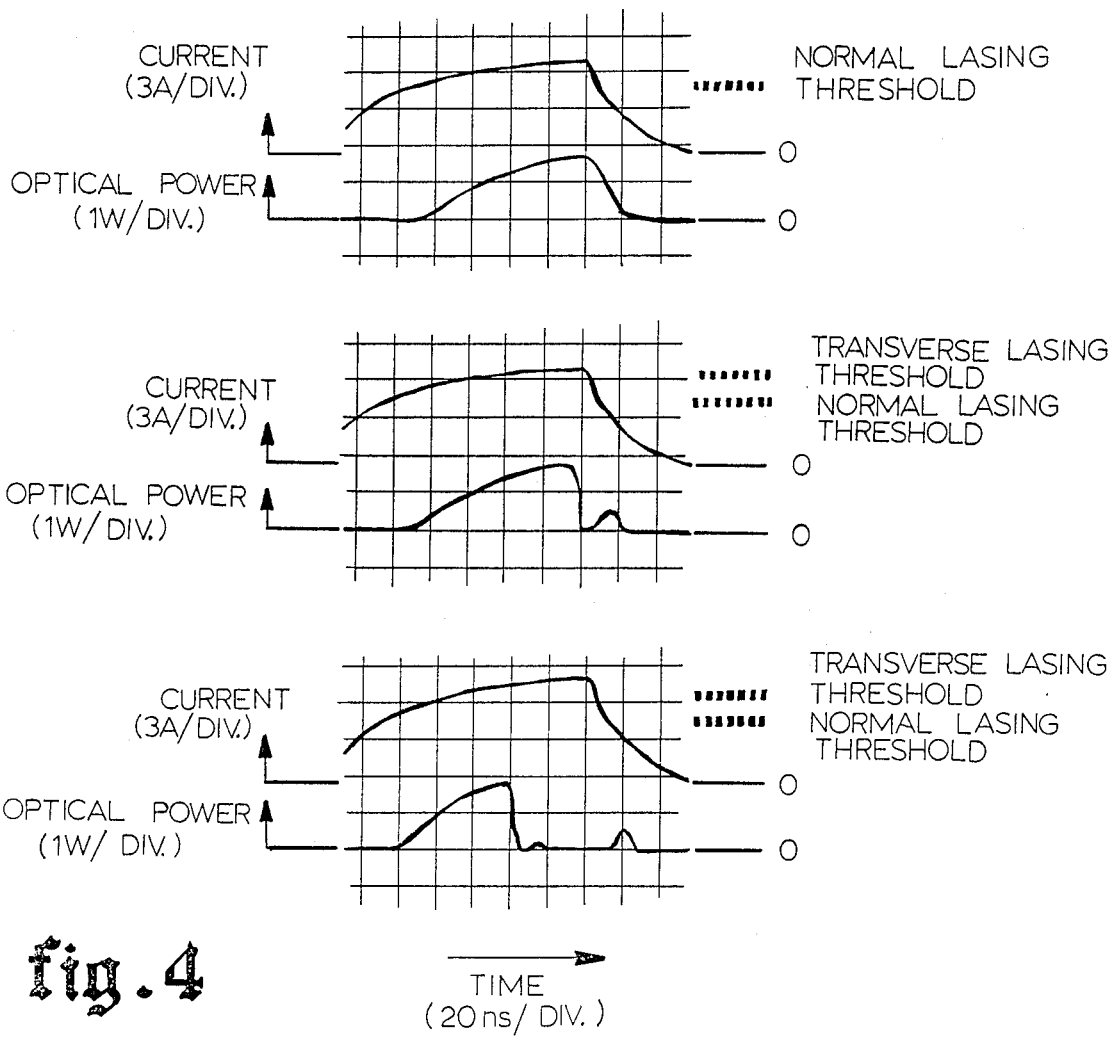
FIG. 4 is comprised of three charts detailing the power output of the present invention with different levels of input.

The multimode laser diode array 20 of the present invention is shown in FIGS. 1A and 1B and 2 and includes a plurality of individual mesas 22 which are spaced across the top of the wafer 24. The layers comprising the wafer 24 are best shown in FIG. 2 and include an upper contact layer 26 which could be either 5000 angstroms of gold or 75 angstroms of nickel chromium and a mesa 22 which is 0.2 microns in height of gallium arsenic. Beneath the mesa 22 is a layer 28 of $Al_{0.4}Ga_{0.6}As$ with a thickness of 1.3 microns, beneath which is another layer 30 of $Al_{0.1}Ga_{0.9}As$ with a thickness of 0.15 microns, and beneath that is layer 32 of $Al_{0.4}Ga_{0.6}As$ with a thickness of 3.3 microns. These three layers 28–32 form the EPI layers of the wafer. Beneath these EPI layers is the substrate 34 which is GaAs having a thickness of 75 microns, and the lower surface of the substrate 34 is coated with a contact layer 36 of 0.5 percent GeAu having a thickness of 3600 angstroms. For normal lasing, an active region 38 is energized and is shown in cross-hatch as part of layer 30 in FIG. 2. Thus, a first laser cavity is formed along the length dimension of the array 20. As shown in FIGS. 3 and 4, at input currents below a "normal" lasing threshold, the array lases in a normal manner along the length dimension. At input currents above the transverse lasing threshold, the array lases instead along the width dimension of the array which can thus be considered a second cavity having a lower laser loss at those higher input currents.

The semiconductor laser device of the present invention is grown in epitaxial layers and processed into a configuration in which the desired output is obtained efficiently along one direction at normal drive currents but is effectively quenched at higher drive currents by loss of carriers to parasitic modes propagating transverse to the normal output direction. Fabrication of such a device can be achieved in the following manner: first, a highly uniform wafer of GaAlAs double heterostructure laser diode material is grown by Metal Organic Chemical Vapor Deposition (MOCVD). Next, the highly doped cap layer is removed in strips 0.006 cm wide by several millimeters long, these strips being spaced 0.012 cm apart, center-to-center, leaving strips of undisturbed wafer material which are 0.006 cm wide. These undisturbed strips are referred to as mesas, and these mesas permit the passage of current to the active layer located near the p-n junction of the device. The strips from which the cap layer has been removed do not permit the passage of current to the epitaxial layers and these areas are normally inactive or nonemitting in a laser device. The metalization layers along both the top and bottom of the wafer are applied to provide contact surfaces, as mentioned above. The wafer is then cleaved into laser arrays 0.5 cm wide (containing 40 stripes) by a cavity length of 0.015 cm. Thus each laser array has a non-emitting region of approximately 0.013 cm. at each side thereof. A highly reflecting coating is applied to one cleaved mirror facet of the 0.5 cm dimension and a passivation coating is applied to the other 0.5 cm mirror facet to provide the Fresnel mirror reflectance of 32%.

Although not shown in the drawing, the devices are mounted p-side down on copper heat sinks using indium solder, as is well known in the art. Alternately, the devices can be mounted with other heat sinking techniques as is known in the art to increase the device capability for higher duty factors. In the present preferred embodiment, duty factors of approximately 5% were found to be adequately heat sinked.

As an alternative to the contact surfaces mentioned above, separate contacts may be applied to the individual stripes using techniques well known in the prior art, such as for example that disclosed in Botez, D. et al "High-power individually Addressable Monolithic Array of Constricted Double Heterojunction LOC Lasers", Appl. Phys. Lett. 41(11), Dec. 1, 82. This individual contact technique permits individual addressing of the stripes as would be useful and desirable in high speed logic applications.

FIG. 3 is a graph of optical output power versus drive current for the device of the present invention, and FIG. 4 is comprised of three charts detailing the power of the present invention at different levels of input current. As shown in these figures, at input currents below a normal lasing threshold, optical power is output, thereby indicating a normal laser operation. However, at input currents above a transverse lasing threshold, normal optical power output almost immediately drops to zero, thereby indicating that normal lasing is quenched virtually instantaneously. At the same time, a laser output is experienced transverse to the normal lasing.

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. In a semiconductor laser device having a plurality of emitting stripe regions and a non-emitting stripe region between adjacent emitting stripe regions, each of said stripes having a length greater than its width, said laser device having means to lase conventionally along the length dimension of the emitting stripes below a threshold input value and means to lase transversely to said length dimension along the width dimension at inputs above said threshold.

2. The device of claim 1 wherein said device has means to lase in only one direction at any chosen input value.

3. The device of claim 2 wherein said device has means to rapidly switch from conventional lasing to transverse lasing and from transverse lasing to conventional lasing in response to rapid changes in the input value to above and below the threshold value, respectively.

4. The device of claim 1 wherein said device has means to switch from conventional lasing to transverse lasing and from transverse lasing to conventional lasing without damage to the device.

5. The device of claim 1 wherein the width of each stripe is substantially the same.

6. The device of claim 5 wherein a non-emitting region stripe is adjacent each outer side.

7. A high speed laser source of substantially digital laser pulses comprising a semiconductor laser device having a plurality of emitting stripe regions and a non-emitting stripe region between adjacent emitting stripe regions, said emitting stripe regions having means to lase conventionally along their length dimension, and means to modulate said conventional lasing by intermittently inducing transverse lasing within said semiconductor laser device to thereby intermittently quench said conventional laser beam.

8. The device of claim 7 wherein said device has means defining an input current threshold, said threshold marking the value at which the device converts from conventional lasing to transverse lasing.

9. The device of claim 8 wherein said modulating means comprises means to vary the input current above and below the threshold value to thereby intermittently induce transverse lasing.

10. The device of claim 9 wherein intermittent transverse lasing does not significantly alter the conventional lasing capabilities of the device.

11. The device of claim 8 wherein each emitting stripe region has substantially the same surface area as each non-emitting stripe region.

12. A semiconductor laser device comprising a linear array of multi-mode laser diodes, said device having a first laser cavity along the length dimension of said diodes and a second laser cavity transverse to said first cavity, said first cavity having a lower laser loss than said second cavity below an input current threshold value and said second cavity having a lower laser loss than said first cavity above said input current threshold value so that as said device is pumped at input currents below said threshold lasing occurs in said first cavity and at input currents above said threshold lasing occurs in said second cavity.

13. The device of claim 12 wherein said linear array comprises a plurality of emitting stripe regions and a non-emitting stripe region between adjacent emitting stripe regions, said first cavity being along the length dimension of said stripes for conventional lasing, and said second cavity being transverse to the first cavity along the width of the array.

14. The device of claim 13 wherein each emitting stripe region has substantially the same surface area as each non-emitting stripe region.

15. The device of claim 14 further comprising a non-emitting region at each side of the array, said side regions having surface areas greater than a stripe surface area.

16. A semiconductor laser device comprising a linear array of laser diodes, said diode array forming a laser cavity for conventional lasing along the length dimension thereof, and means to limit the output power above a pre-determined input current threshold by quenching said conventional laser output at input currents above said threshold.

17. The device of claim 16 wherein the quenching means further comprises means to induce lasing transverse to the array.

18. The device of claim 17 wherein the linear array comprises a plurality of emitting stripe regions and a non-emitting stripe region between adjacent emitting stripe regions.

19. The device of claim 18 wherein each emitting stripe region has substantially the same surface area as each non-emitting stripe region.

20. The device of claim 17 further comprising means to re-initiate conventional lasing and quench transverse lasing in response to a reduction of the input current below the threshold.

21. A semiconductor laser logic device comprising a linear array of a plurality of laser diodes, each of said diodes being separately accessible for the application of an input current to induce conventional lasing along the length dimension thereof, and means to produce a laser output transversely through said array upon the application of an input current above a pre-determined threshold to each of said diodes.

* * * * *